United States Patent
Feiweier

(10) Patent No.: US 10,509,089 B2
(45) Date of Patent: *Dec. 17, 2019

(54) METHOD AND MAGNETIC RESONANCE APPARATUS TO ACQUIRE TRACE-WEIGHTED MAGNETIC RESONANCE DATA WITH ANISOTROPIC DIFFUSION DIRECTIONS

(71) Applicant: Siemens Healthcare GmbH, Erlangen (DE)

(72) Inventor: Thorsten Feiweier, Poxdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/120,749

(22) Filed: Sep. 4, 2018

(65) Prior Publication Data

US 2019/0072630 A1 Mar. 7, 2019

(30) Foreign Application Priority Data

Sep. 4, 2017 (DE) .................. 10 2017 215 444

(51) Int. Cl.
*G01R 33/563* (2006.01)
*G01R 33/56* (2006.01)

(52) U.S. Cl.
CPC ... *G01R 33/56341* (2013.01); *G01R 33/5608* (2013.01)

(58) Field of Classification Search
CPC ............ G01R 33/56341; G01R 33/385; G01R 33/5608; G01R 33/543
See application file for complete search history.

(56) References Cited

U.S. PATENT DOCUMENTS

| | | | |
|---|---|---|---|
| 5,539,310 A * | 7/1996 | Basser | G01R 33/56341 324/307 |
| 6,288,540 B1 | 9/2001 | Chen et al. | |
| 6,969,991 B2 | 11/2005 | Bammer et al. | |
| 2011/0085722 A1* | 4/2011 | Feiweier | G01R 33/56341 382/131 |

(Continued)

OTHER PUBLICATIONS

Tuch, "Q-Ball Imaging", in: Magnetic Resonance Medicine; vol. 52; pp. 1358-1372; (2004).
Kingsley : "Introduction to Diffusion Tensor Imaging Mathematics", Concepts in Magnetic Resonance Part A, vol. 28, pp. 101-122; (2006).

(Continued)

*Primary Examiner* — Patrick Assouad
*Assistant Examiner* — Haidong Zhang
(74) *Attorney, Agent, or Firm* — Schiff Hardin LLP

(57) ABSTRACT

In a method and a magnetic resonance (MR) apparatus for diffusion-gradient MR imaging, vectors for the diffusion gradients are determined by generating a cuboid with edges that represent the maximum amplitudes that are achievable by the gradient system of the MR apparatus, and a spherical shell is also generated that represents limit values for effective gradient amplitudes. Areas of the spherical shell that are within the cuboid are used as end points of origin vectors that originate from the origin of the intersecting axes of the gradient system. Diffusion gradient vectors that are to be used for acquiring the diffusion-weighted MR data are then selected from these origin vectors dependent on fulfillment of a condition for producing a trace-weighted image with low artifacts.

17 Claims, 5 Drawing Sheets

(56) References Cited

U.S. PATENT DOCUMENTS

| | | | |
|---|---|---|---|
| 2013/0088228 A1* | 4/2013 | Feiweier | G01R 33/4838 |
| | | | 324/309 |
| 2015/0253410 A1* | 9/2015 | Warfield | A61B 5/055 |
| | | | 324/309 |
| 2017/0322281 A1 | 11/2017 | Feiweier | |
| 2018/0348325 A1 | 12/2018 | Feiweier et al. | |

OTHER PUBLICATIONS

Conturo et. al.: "Encoding of Anisotropic Diffusion with Tetrahedral Gradients: A General Mathematical Diffusion Formalism and Experimental Results", in: Magnetic Resonance in Medicine, vol. 35, pp. 399-412; (1996).

Malyarenko, D.: "Analysis and correction of gradient nonlinearity bias in ADC measurements", Magnetic Resonance in Medicine, vol. 71(3), pp. 1312-1323, (2014).

Wong et. al.: "Optimized Isotropic Diffusion Weighting", in: Magnetic Resonance in Medicine, vol. 34, pp. 139-143; (1995).

Jones, "The Effect of Gradient Sampling Schemes on Measures Derived From Diffusion Tensor MRI: A Monte Carlo Study",: Magnetic Resonance in Medicine; vol. 51, pp. 807-815; (2004).

Basser, et al.: "A Simplified Method to Measure the Diffusion Tensor from Seven MR Images"; in: Magnetic Resonance in Medicine, vol. 39, pp. 928-934; (1998).

German action dated Jul. 3, 2019, for application No. 10 2017 215 444.6.

Nitz, Wolfgang R.: MRT-Guide für MTRA/RT. Thieme: Edition Radiopraxis, 2012, Seiten 104-106.—ISBN 10.1055/b-0036-136491, and English translation.

* cited by examiner

METHOD AND MAGNETIC RESONANCE APPARATUS TO ACQUIRE TRACE-WEIGHTED MAGNETIC RESONANCE DATA WITH ANISOTROPIC DIFFUSION DIRECTIONS

BACKGROUND OF THE INVENTION

Field of the Invention

The invention concerns a method for establishing diffusion gradients for recording of diffusion-weighted magnetic resonance data with anisotropic diffusion directions for creating a trace-weighted image. The invention also concerns a method for acquiring diffusion-weighted magnetic resonance data of an examination object for creating a trace-weighted image. The invention also concerns a magnetic resonance apparatus, and a diffusion gradient-establishing computer, and a non-transitory, computer-readable data storage medium that implement such a method.

Description of the Prior Art

As used herein, magnetic resonance recordings are to be understood as image data from within an examination object created by the operation of a magnetic resonance apparatus, as well as parameter maps, which reflect a spatial or temporal distribution of specific parameter values within the examination object and can be created from the image. Recording magnetic resonance data means operating a magnetic resonance imaging apparatus, or the MR scanner thereof, in order to acquire raw data from a subject, which are then processed and used to reconstruct image data.

Diffusion-weighted magnetic resonance recordings are magnetic resonance recordings, with which the diffusion movement of specific substances, in particular of water molecules, in the body tissue can be measured and shown in a spatially resolved manner. Diffusion imaging in everyday clinical practice has established itself in particular in the diagnosis of strokes, since the affected regions of the brain are already recognizable more clearly and at an earlier stage in diffusion-weighted images than in classical magnetic resonance recordings. In addition diffusion weighting is also used to an increasing extent in the area of ontological, cardiological and musculoskeletal diseases. A variant of diffusion-weighted magnetic resonance tomography is diffusion tensor imaging, in which the direction dependency of the diffusion is also detected. As used herein, diffusion-weighted magnetic resonance recordings include both magnetic resonance recordings acquired within the framework of diffusion-weighted magnetic resonance tomography and also magnetic resonance recordings created within the framework of diffusion tensor imaging.

For the creation of diffusion-weighted magnetic resonance recordings first of all diffusion-encoded raw image data must be acquired. This is done with specific measurement sequences, which are referred to below as diffusion gradient measurement sequences, A characteristic of these measurement sequences is that, after a usual deflection of the spins in a plane at right angles to the basic magnetic field of the magnetic resonance scanner, a specific sequence of gradient magnetic field pulses is applied, which vary the field strength of the external magnetic field in a predetermined direction. If there is a diffusion movement present the preceding nuclei move out of the phase, which manifests itself in the measurement signal.

In diffusion weighting, usually a number of images are recorded with different diffusion directions and weightings, i.e. with different diffusion encoding gradient pulses, and combined with one another. The strength of the diffusion weighting is mostly defined by what is referred to as the diffusion-weighting factor, also known as the "b value". The different diffusion images or the images or parameter maps combined therefrom can then be used for the desired diagnostic purposes. In order to enable the influence of the diffusion movement to be estimated correctly, a further reference recording is used by comparison in many cases, in which no diffusion encoding gradient pulse is applied, i.e. an image with b=0. The pulse measurement sequence for acquisition of the reference raw image data is structured in the same way as the diffusion gradient measurement sequence, with the exception of the sending out of the diffusion encoding gradient pulses. As an alternative a reference recording with a b value≠0 can also be carried out.

Usually images or parameter maps are used for diagnosis in MR diffusion weighted imaging, in which a free diffusion process, also referred to as a free normal Gaussian diffusion process, with an apparent diffusion coefficient (ADC) is assumed. This process is characterized by the signal strength decreasing in accordance with an exponential relationship as a function of the diffusion-weighting factor.

Expansions of this model take account for example of the directional dependency of the diffusion in microscopically restricted geometries: For example water molecules can move more quickly along nerve fibers than at right angles thereto. The diffusion tensor model still detects these relationships by assuming a now direction-dependent free normal Gaussian diffusion process and allows the calculation and presentation of associated parameters or parameter values, such as for example parameters relating to the direction anisotropy.

Above and beyond this there are a series of further approaches, with which deviations from the Gaussian behavior can be described with corresponding model functions. These include for example the IVIM model (IVIM=Intra-Voxel Incoherent Motion), in which the starting point is a bi-exponential drop in the signal amplitude as a function of the b value as a result of perfusion effects. This class of approaches also includes the Kurtosis model, in which deviations from the exponential dependency of the signal strength on the b value are modeled with higher-order tensors.

The acquisition of a plurality of diffusion directions and/or weightings makes it possible to obtain a more precise picture about the local diffusion geometry. With HARDI (High Angular Resolution Diffusion Imaging), DSI (Diffusion Spectrum Imaging) or the Q-Ball method (see David S. Tuch, "Q-Ball Imaging", Magnetic Resonance in Medicine 52:1358-1372 (2004)), a number of preferred directions within an image voxel are thus able to be resolved.

Moreover there are also methods with which the dependency of the signal intensity not only of the b value and the direction, but also of specific interval durations is taken into account in the experiment, in order with model assumptions to draw conclusions about microscopic tissue parameters (e.g. the axon radius, the surface-to-volume ratios etc.).

The last-named group of methods offers the opportunity of generating new contrasts based the diffusion with possibly a higher clinical value.

In the recording of diffusion image data by means of diffusion-weighted magnetic resonance imaging the available gradient amplitude G represents a central performance feature. This is because the larger the gradient amplitude is, the shorter is the time needed to realize a predetermined diffusion weighting. This can be seen for example with reference to the Stejskal-Tanner equation:

$$b=\gamma^2 G^2 \tau^2 (\Delta-\tau/3). \quad (1)$$

In this equation $\gamma$ is the gyromagnetic ratio, $\tau$ the duration of each of the two (ideally assumed as rectangular) diffusion gradients and $\Delta$ the distance in time between the diffusion gradients. If for example the gradient G is doubled, then the effective time $T=\Delta-\tau/3$ can be reduced to a quarter, assuming that the gradient timer remains unchanged, if the b value is to remain the same. The specification "a quarter" is approximately true for the case in which the value of the time distance of the diffusion gradients $\Delta$ is large compared to the gradient time $\tau$. FIG. 1 illustrates a Stejskal-Tanner sequence for diffusion-weighted magnetic resonance imaging.

Thus the gradient amplitude G has a direct influence of the achievable signal-to-noise ratio (SNR) of an individual measurement. This is because shorter diffusion coding time allows relaxation influences to be reduced, for example by a reduction in the echo time TE which is then possible. The SNR gain can be used for example to improve the image quality, to, reduce, the measurement time or to increase the resolution.

In order to utilize the maximum gradient amplitude of system available per physical axis in the optimum way, possible, as a rule gradient pulses are applied simultaneously to a number of axes. In such cases it is the vector sum of the amplitude of the effective gradients $G_{eff}=\sqrt{G_x^2+G_y^2+G_z^2}$, which can be up to $\sqrt{3}$ times higher than the individual axis amplitudes $G_x, G_y, G_z$ that is decisive for diffusion coding.

In an isotropic diffusion process, in which no direction is highlighted, in principle measurement with one diffusion direction is sufficient, In this case the gradient amplitudes $G_x=G_y=G_z=G_{max}$, can be selected and $G_{eff}=G_{max}*\sqrt{3}$ is obtained as the effective gradient, i.e. the maximum possible performance. However in tissue types with marked anisotropies, such as for example, nerve or muscle fibers, this approach leads to undefined results, since the diffusion weighting depends on the a priori unknown relative alignment between the tissue, and the coordinate system of the gradients.

Moreover for establishing specific diffusion measures, such as for example a trace weighting, Apparent Diffusion Coefficient ADC or tensor sizes, such as the fractional anisotropy, diffusion-weighted image recordings with a number of diffusion directions are needed, for which defined boundary conditions must be fulfilled. The additional boundary conditions as a rule significantly restrict the opportunities for a simultaneous application to a number of axes.

At the same time however it is desirable to work with as many different directions as possible. Image artifacts can occur in diffusion weighting, of which the manifestation depends heavily on the selected diffusion direction. For example, image distortions can occur as a result of dynamic field disturbances (eddy current fields), or undesired variations in image brightness (inhomogeneities) as a result of mechanical vibrations or likewise caused by eddy current fields. Because of the directional dependency an averaging effect sets in with an increasing number of diffusion directions, so that artifacts occurring for individual directions can be implicitly suppressed in the final image.

For quantification of an anisotropic diffusion process, for example in the form of a trace dimension, the recording of at least three non-collinear diffusion directions is needed. Suitable sets of directions are for example:

Orthogonal: $(G_x, G_y, G_z)=(1, 0, 0), (0, 1, 0), (0, 1, 0)$,
In this set of directions $G_{eff}=G_{max}$; Optimized orthogonal: $(G_x, G_y, G_z)=(1, 1, -\frac{1}{2}), (1,-\frac{1}{2}, 1), (-\frac{1}{2}, 1, 1)$,
In this set of directions $$G_{eff} = G_{max} * \sqrt{\frac{9}{4}};$$

Tetrahedral: $(G_x, G_y, G_z)=(-1, 1, 1), (1, -1, 1), (-1, -1, -1), (1, 1, -1)$,
In this set of directions $G_{eff}=G_{max}*\sqrt{3}$;
Octahedral: $(G_x, G_y, G_z)=(1, 0, 1), (-1, 0, 1), (0, 1, 1), (0, 1, -1), (0, 1, -1), (1, 1, 0), (-1, 1, 0)$,
In this set of directions $G_{eff}=G_{max}*\sqrt{3}$.

In general the following condition must be fulfilled so that a trace-weighted image can be created from a set of diffusion directions:

$$\frac{N}{3}b \cdot 1 = \sum_{n=1...N} b_n, \quad (2)$$

wherein I represents the unity matrix, b the b value and $b_n$ represents the b matrixes assigned to the N diffusion directions. As a rule each b matrix can be represented as $b_n=b \cdot e_n \cdot e^*_n$, with the respective direction vector $e_n$ and the adjoint or transposed direction vector $e^*_n$.

For the optimized orthogonal case the following is found $$b_1 = b' \begin{pmatrix} 1 & & 1-\frac{1}{2} \\ & 1 & 1-\frac{1}{2} \\ -\frac{1}{2} & -\frac{1}{2} & +\frac{1}{4} \end{pmatrix}, \quad (3)$$

$$b_2 = b' \begin{pmatrix} 1 & -\frac{1}{2} & 1 \\ -\frac{1}{2} & +\frac{1}{4} & -\frac{1}{2} \\ 1 & -\frac{1}{2} & 1 \end{pmatrix}, b_3 = b' \begin{pmatrix} +\frac{1}{4} & -\frac{1}{2} & -\frac{1}{2} \\ -\frac{1}{2} & 1 & 1 \\ -\frac{1}{2} & 1 & 1 \end{pmatrix}$$

and thus $$\sum_{n=1...3} b_n = b' \begin{pmatrix} 1 & 0 & 0 \\ 0 & 1 & 0 \\ 0 & 0 & 1 \end{pmatrix} \text{ with } b = 9/4 \; b'. \quad (4)$$

Trace images can be calculated from the individual diffusion-weighted images $S_n = M \exp(-Tr(D \; b_n))$ in accordance with:

$$S_{Trace} = \prod_{n=1...N} S_n^{1/N} = M \cdot \left(-\frac{1}{N} Tr\left(D \sum_{n=1...N} b_n\right)\right) = M \cdot \exp\left(-\frac{1}{3} b \cdot Tr(D)\right). \quad (5)$$

The four direction vector sets listed from the prior art all exhibit an isotropic spatial distribution (in this case account is to be taken of the fact that the diffusion encoding is invariant compared to an inversion of the direction polarity).

However this is advantageous but not needed for tensor estimations (possible as from six directions, i.e. for example with the octahedral directions).

DE 10 2016 207 910.7 describes how tensor information can also be determined with at least six anisotropically distributed directions (and at least two b values). The option of determining "simple" trace images (and derived parameters, such as for example ADC maps) through a suitable combination of diffusion-weighted images—for example by geometrical averaging—is not discussed in said document however. The information obtained in the procedure disclosed in DE 10 2016 207 910.7 does not allow sets of directions with at least 6 directions to be determined, with can be combined with geometrical averaging into one trace image.

SUMMARY OF THE INVENTION

An object of the present invention is to provide a method for acquiring diffusion-weighted magnetic resonance raw data with anisotropic diffusion directions for creation of a trace-weighted image as well as a control device suitable for said task for a magnetic resonance system, with which the highest possible performance with good image quality can be achieved.

In the inventive method for establishing diffusion gradients for a recording of diffusion-weighted magnetic resonance image data with anisotropic diffusion directions for creation of a trace-weighted image the space of realizable diffusion gradient vectors is defined as a cuboid, oriented along physical gradient axes of a gradient system with an extent of the edges of the cuboid corresponding to the maximum gradient amplitudes of gradients in the direction of the physical gradient axes of the gradient system. A gradient system of a magnetic resonance system usually includes a number of gradient coils for creation of gradient fields in various spatial directions.

A value interval for an effective gradient amplitude with a minimum value and a maximum value for the effective gradient amplitude is defined. Furthermore a spherical shell around the origin of the physical gradient axes with an internal radius with the minimum value and an external radius with the maximum value is set or established. Those part areas of the spherical shell that lie within the cuboid are established as end points of possible candidate origin vectors. Finally a set of at least six diffusion gradient vectors, which fulfill additional conditions for the creation of a low-artifact trace-weighted image with a set of directions of diffusion gradient vectors, are selected from the set of the candidate origin vectors. Additional conditions for the creation of a low-artifact trace-weighted image are to be understood in this case as conditions for the orientation of the diffusion gradient vectors, which, when adhered to, make it possible to calculate a low-artifact trace-weighted image.

Since the gradient amplitudes used for the creation of the diffusion gradient vectors have a direct influence on the achievable signal-to-noise ratio of an individual measurement, it is especially advantageous for the effective gradient amplitudes to be as high as possible. The inventive method allows a desired effective gradient amplitude to be selected in advance and then delivers possible diffusion gradient vectors to be used. Advantageously relaxation influences are able to be reduced by the greater effective gradient amplitude as a result of a shortened diffusion encoding time, for example by a possible reduction of the echo time that is then possible. The gain in the signal-to-noise ratio can be used for example to improve the image quality, to reduce the measurement time or for increasing the resolution of the trace-weighted diffusion images.

In the inventive method for recording of diffusion-weighted magnetic resonance image data of an examination object for creation of a trace-weighted image a set of diffusion gradient vectors is established with the use of the inventive method for establishing diffusion gradients for a recording of diffusion-weighted magnetic resonance image data with anisotropic diffusion directions for creation of a trace-weighted image. There is then an acquisition of diffusion-encoded raw image data by means of a diffusion encoding gradient pulse sequence, having the established diffusion gradient vectors. Furthermore diffusion-encoded trace-weighted image data is reconstructed on the basis of the diffusion-encoded raw image data. Finally a diffusion behavior is established on the basis of the diffusion-encoded image data.

In trace weighting the trace of the diffusion tensor is used as a weighting variable in principle, as S_Trace=M exp(−b Tr(D)). The trace involves an invariant in relation to rotations, i.e. independent of the spatial orientation of the diffusion tensor (i.e. of the anatomies possibly restricting the diffusion process, for example nerve fibers) the same weighting being displayed in the image for otherwise identical diffusion characteristics. This makes it easier for example to identify pathological structures in the diagnosis of strokes: with a pure diffusion weighting along a spatial axis both geometry (alignment of the nerve fibers relative to the gradient axis) and also mobility of the image contrast. The contrast of a trace-weighted image is independent of the local geometry.

The inventive computer for establishing diffusion gradients has an input interface for receiving maximum gradient amplitudes of gradients in the direction of the physical gradient axes of a gradient system, which determines the space of realizable diffusion gradient vectors as a cuboid, oriented along the physical gradient axes with an extent of the edges of the cuboid corresponding to the maximum gradient amplitudes of the gradients in the direction of the physical gradient axes of the gradient system. The input interface moreover serves to receive a selected value interval for an effective gradient amplitude with a minimum value and a maximum value for the effective gradient amplitude. The inventive computer for establishing diffusion gradients has a processor (processor circuitry) that establishes a spherical shell for establishing a spherical shell around the origin of the physical gradient axes with an internal radius with the minimum value and an external radius with the maximum value. Furthermore the inventive computer for establishing diffusion gradients has a processor (processor circuitry) that establishes part areas for establishing those part areas of the spherical shell that lie within the cuboid, as end points of possible candidate origin vectors. The computer for establishing diffusion gradients also has a selection processor that selects a set of at least six diffusion gradient vectors, which fulfill additional conditions for the creation of a low-artifact trace-weighted image with set of directions of diffusion gradient vectors, from the set of the candidate origin vectors. The inventive computer for establishing diffusion gradients shares the advantages of the inventive method for establishing diffusion gradients for a recording of diffusion-weighted magnetic resonance image data with anisotropic diffusion directions for creation of a trace-weighted image.

A magnetic resonance apparatus according to the invention has a basic field magnet, an RF transmit antenna system, a gradient coil system, an RF reception antenna system, and the inventive computer for establishing diffusion gradients. The inventive magnetic resonance apparatus shares the advantages of the inventive device for establishing diffusion gradients.

The inventive computer for establishing diffusion gradients can preferably be realized in the form of software on a suitable programmable control computer of the magnetic resonance apparatus with corresponding storage options. The radio-frequency transmit device, the gradient system interface and the radio-frequency receive device can be realized at least partly in the form of software units, wherein in their turn other units of these components are pure hardware units, for example a radio-frequency amplifier, the radio-frequency transmit device, a gradient pulse creation device of the gradient system interface or an Analog/Digital converter of the radio-frequency receive device etc. A largely software-based realization, in particular of the aforementioned units, has the advantage that even magnetic resonance system control devices already used previously can be upgraded in a simple manner, in order to work in the inventive way.

The present invention, therefore, also encompasses a non-transitory, computer-readable data storage medium encoded with programming instructions (program code) that, when the storage medium is loaded into a computer or computer system of a magnetic resonance apparatus, cause the computer or computer system to operate the magnetic resonance apparatus so as to implement any or all embodiments of the method according to the invention, as described above.

The data storage medium may have additional elements such as documentation and/or hardware components, such as hardware keys (dongles etc.) for using the software represented by the program code.

The computer-readable storage medium may be, for example, a memory stick, a hard disk or any other transportable or permanently-installed image data medium.

In a preferred development of the inventive method for establishing diffusion gradients for a recording of diffusion-weighted magnetic resonance image data with anisotropic diffusion directions for creation of a trace-weighted image the additional conditions for the creation of a low-artifact trace-weighted image are:

$$N/3 \cdot b \cdot 1 = \sum_{n=1...N} b_n. \quad (2)$$

the sets of directions of the diffusion gradient vectors have an anisotropic distribution.

In the above, "N" stands for the number of the diffusion directions or the number of the diffusion gradient vectors, "b" for the b value, "I" for the identity matrix and "$b_n$" for the b matrixes assigned to the N diffusion directions.

In a variant of the inventive method for establishing diffusion gradients for a recording of diffusion-weighted magnetic resonance image data with anisotropic diffusion directions for creation of a trace-weighted image the maximum value for the effective gradient amplitude is smaller than $\sqrt{3}$ times the largest of the maximum gradient amplitudes on the individual physical axes.

In a specific variant of the inventive method for establishing diffusion gradients for a recording of diffusion-weighted magnetic resonance image data with anisotropic diffusion directions for creation of a trace-weighted image, the cuboid of the space of realizable diffusion gradient vectors is embodied as a cube and the maximum gradient amplitudes in the x, y and z direction each have the same value. Often, because of the hardware, the gradient coils have the same maximum gradient amplitude, so that for the sake of simplicity the space of realizable diffusion gradient vectors can be assumed to be a cube.

In an embodiment of the inventive method for establishing diffusion gradients for a recording of diffusion-weighted magnetic resonance image data with anisotropic diffusion directions for creation of a trace-weighted image the value interval for an effective gradient amplitude converges toward a limit value, so that the minimum value and the maximum value for the effective gradient amplitude are equal to the limit value and the spherical shell is embodied as a sphere surface. This means that instead of an interval, a specific value for the effective gradient amplitude is defined. In this variant those surface segments of the sphere surface that lie within the cuboid are then established as end points of possible candidate origin vectors. Although with this variant the degree of freedom in the choice of diffusion gradient vectors is not as great as with the use of a value interval for the effective gradient amplitude, in this variant the effective gradient amplitude of the diffusion gradient vectors does not vary for this, so the b value too does not vary. For trace-weighted imaging it is an absolute requirement that the b value does not vary sharply, which is also expressed by equation (6). The image contrast naturally changes in the diffusion weighting with the b value. Thus the diffusion-weighted native images exhibit a more homogeneous contrast with an unchanged b value than with a variation of the b value.

This becomes especially relevant as soon as there is a departure from the domain of the Gaussian diffusion processes. For example in the IVIM method the dependency of the diffusion contrast on the b value is explicitly analyzed: in this case all images that are relevant, e.g. for the calculation of a trace weighting, should have a very similar b value.

In an advantageous embodiment of the inventive method for establishing diffusion gradients for a recording of diffusion-weighted magnetic resonance image data with anisotropic diffusion directions for creation of a trace-weighted image, those surface segments of the sphere surface that lies within the cuboid are established as end points of possible candidate origin vectors.

In a variant of the inventive method for establishing diffusion gradients for a recording of diffusion-weighted magnetic resonance image data with anisotropic diffusion directions for creation of a trace-weighted image, the sets of directions of the at least six diffusion gradient vectors are based on a combination of three orthogonal vectors and the amount of all components of the sets of directions in each case has a value <=1. Advantageously the described vectors fulfill the conditions given above for the creation of a low-artifact trace-weighted image.

In a specific variant of the inventive method for establishing diffusion gradients for a recording of diffusion-weighted magnetic resonance image data with anisotropic diffusion directions for creation of a trace-weighted image the value of $$\sqrt{\frac{9}{4}}$$

times the maximum gradient amplitudes is selected as the value for the effective gradient amplitude and the set of diffusion gradient vectors has a combination of at least two sets of the following 8 sets consisting in each case of three orthogonal vectors:

(+1, +1, +½), (+1, −½, −1), (+½, −1, +1),
(+1, −1, +½), (+1, +½, −1), (+½, +1, +1),
(+1, +1, −½), (+1, −½, +1), (+½, −1, −1),
(+1, −1, −½), (+1, +½, +1), (+½, +1, −1),
(−1, −1, −½), (−1, +½, +1), (−½, +1, −1),
(−1, +1, −½), (−1, −½, +1), (−½, −1, −1),
(−1, −1, +½), (−1, +½, −1), (−½, +1, +1),
(−1, −1, +½), (−1, −½, −1), (−½, −1, +1).

The three orthogonal vectors listed in each case build on the optimized orthogonal directions. With at least six anisotropic directions an identical effective diffusion encoding is able to be realized. Each of the individual sets of direction fulfills the condition (2) for trace-weighted imaging, but is also isotropic. If at least two sets of directions are used jointly, as will be illustrated in accordance with the invention, ultimately a set with six anisotropic directions is produced, wherein individual sets of directions or even individual vectors of the sets of directions can also be inverted, i.e. can be provided with reversed leading signs. This anisotropic set of directions also fulfills the condition (2) and allows identically short echo times like the optimized orthogonal directions. The fact that six different directions are included in the averaging of the trace images, advantageously enables artifacts to be reduced however. An inventive set of directions with six anisotropic directions has a far larger number of directions than with an optimized orthogonal scheme for example, wherein at the same time the efficiency of the diffusion encoding is identical, i.e. the same echo times are able to be realized. The inventive set of directions with six anisotropic directions also has more directions than a tetrahedral scheme, so that the artifacts during imaging are advantageously reduced. The inventive set of directions with six anisotropic directions has an identical number of directions as an octahedral scheme, but makes a more efficient diffusion encoding possible however, i.e. shorter echo times are able to be realized.

Analogously to this, anisotropic sets of directions with 9, 12, 15, 18, 21 and 24 vectors, based on the 8 sets shown, are also able to be used for trace-weighted imaging. As an additional variant sets of directions based on the vectors shown are also able to be constructed, wherein however each of the vectors shown is entered independently of one another.

In an embodiment of the inventive method for establishing diffusion gradients for a recording of diffusion-weighted magnetic resonance image data with anisotropic diffusion directions for creation of a trace-weighted image the sets of directions of the at least six diffusion gradient vectors are based on a combination of six octahedral vectors and the amount of all components of the sets of directions ($e_n$) has a value of <=1.

For example the diffusion gradient vector set can comprise a combination of at least two sets of the following 3 sets:

(+1, 0, +1), (+1, 0, −1), (+1/√2, +1, +1/√2), (−1/√2, +1, +1/√2), (+1/√2, +1, —1/√2, (−1/√2, +1, −1/√2),
(0, +1, +1), (0, +1, −1), (+1, +1/√2, +1/√2), (+1, −1/√2, +1/√2), (+1, +1/√2−1/√2), (+1, −1/√2, −1/√2),
(+1, +1, 0), (+1, −1, 0), (+1/√2, +1/√2, +1), (−1/√2, +1/√2, +1), (+1/√2, −1/√2, +1), (−1/√2, −1/√2, +1).

The sets shown are based on combinations of isotropic octahedral vectors. If two or three of the sets of directions shown are combined, then sets of directions with 12 or 18 directions are always produced. Together with the inverted variants of the sets of gradient vectors or sets of directions shown sets of directions with 24, 30 or 36 directions are also able to be assembled.

In a variant of the inventive method for recording of diffusion-weighted magnetic resonance image data of an examination object for creation of a trace-weighted image a non-linearity of a gradient system used for creation of the diffusion gradients is taken into account in establishing the diffusion behavior. I.e. the inventive process can be combined with a correction of gradient non-linearities, as is described for example in EP 171 73750.5.

In an embodiment of the inventive method for recording of diffusion-weighted magnetic resonance image data of an examination object for creation of a trace-weighted image, if the user requires image recording with a number N of isotropic directions and a number, i.e. K averagings per direction, instead of this a single image recording with a set of diffusion gradient vectors established with the inventive method for establishing diffusion gradients for a recording of diffusion-weighted magnetic resonance image data with anisotropic diffusion directions for creation of a trace-weighted image with N*K anisotropic directions with identically effective gradient amplitude will be suggested. In this case N and K are natural numbers.

The user can naturally always "overrule" the system and force their required measurement parameters.

An averaged and thus low-artifact image recording can be carried out in a single pass, whereby the time outlay is reduced and the convenience for a patient is improved.

DESCRIPTION OF THE PREFERRED EMBODIMENTS

Figure 1:
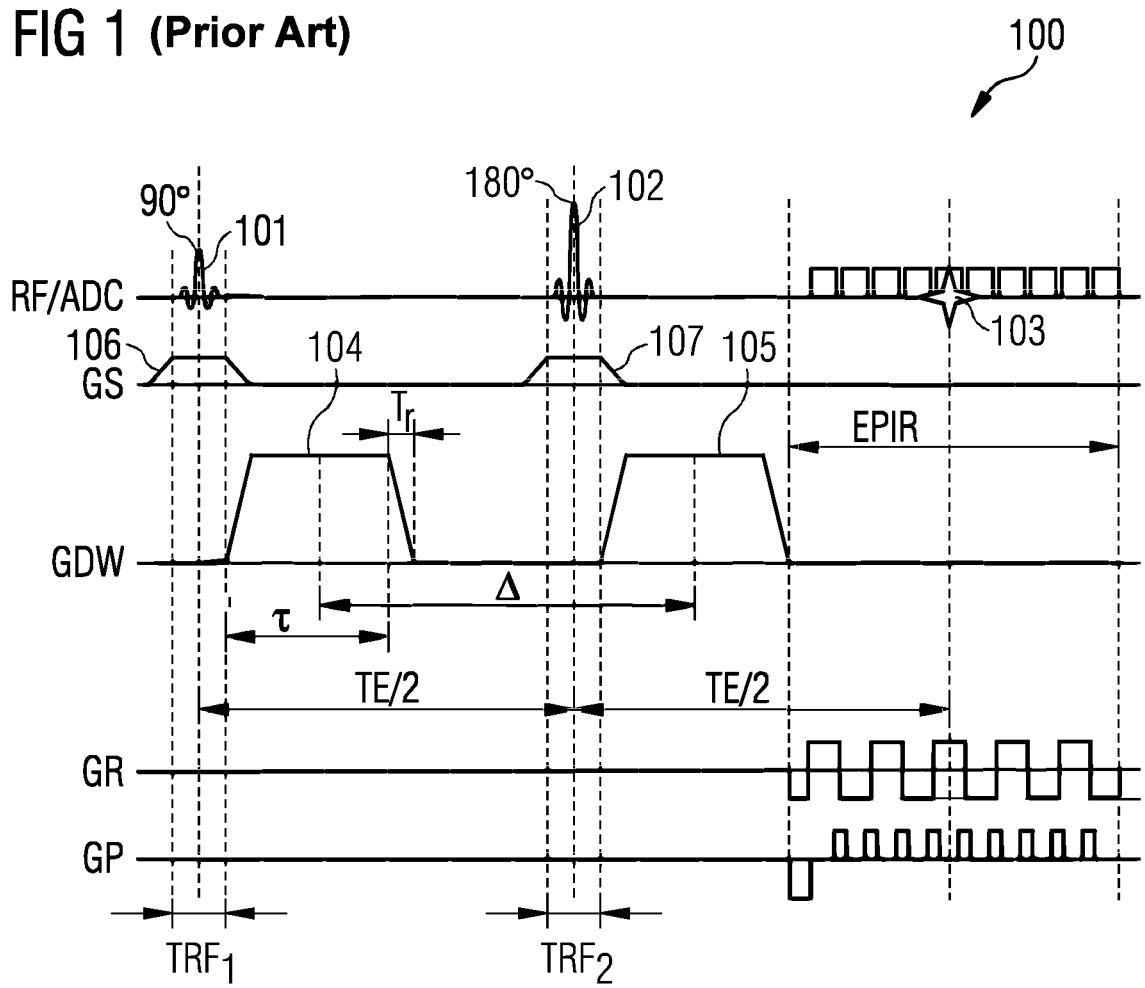
FIG. 1 shows a pulse diagram for a Stejskal-Tanner experiment for diffusion-weighted imaging.

Shown in FIG. 1 is a Stejskal-Tanner sequence 100. This is a frequently used diffusion-weighted pulse sequence. In the first line of the diagram, which is labeled RF/ADC, An RF excitation pulse 101 with a duration $TRF_1$, which is applied at the beginning of a pulse sequence at the same time as a slice selection gradient 106 (see second line GS), and an RF refocusing pulse 102 with a duration $TRF_2$, which is applied between two diffusion contrast gradient pulses 104, 105 (see third line GDW) and with which at the same time a slice selection gradient 107 (see second line GS) is likewise supplied. The gradient pulses 104, 105 have the same polarity and as a rule the same amplitude and duration. The RF refocusing pulse 102 forms a spin echo 103 (see first line), which in the example depicted is read out with an EPI echo readout train EPIR, comprising a plurality of readout windows. Furthermore, in the diagram in FIG. 1, the second line from the bottom shows a gradient scheme GR in the readout direction (frequency encoding direction) and the bottom line shows a gradient scheme GP in the phase encoding direction.

The echo time TE is the time between the RF excitation pulse 101 and the echo 103. The formation of the echo is produced by the disappearing moment of all applied gradients along the three axes. The position of the refocusing pulse is preferably selected at TE/2, in order also to compensate for the moments generated by static magnetic field gradients (e.g. as a result of B0 inhomogeneities in the object) precisely at the echo time.

For the Stejskal-Tanner scheme shown in FIG. 1 with symmetrical trapezoidal diffusion gradients 104, 105 with the amplitude G and disappearing ramp time $T_r$, the following is obtained for the b value:

$$b=\gamma^2 G^2[\tau^2(\Delta-\tau/3)]. \qquad (6)$$

In this equation $\tau$ is the so-called duration of a gradient and $\Delta$ is the time that elapses between the switching on of the two gradient pulses 104, 105, i.e. the distance in time between the said gradient pulses 104, 105. The time intervals just defined are visualized in FIG. 1. G is the gradient strength or gradient amplitude of the diffusion gradients 104, 105. The constant $\gamma$ specifies the gyromagnetic ratio. In formula (6) only the amount of the idealized diffusion contrast gradients 104 and 105 for the b value of the sequence is taken into account.

Instead of the Stejskal-Tanner sequence 100 shown in FIG. 1, other diffusion sequences can also be used for diffusion-weighted magnetic resonance imaging.

Figure 2:
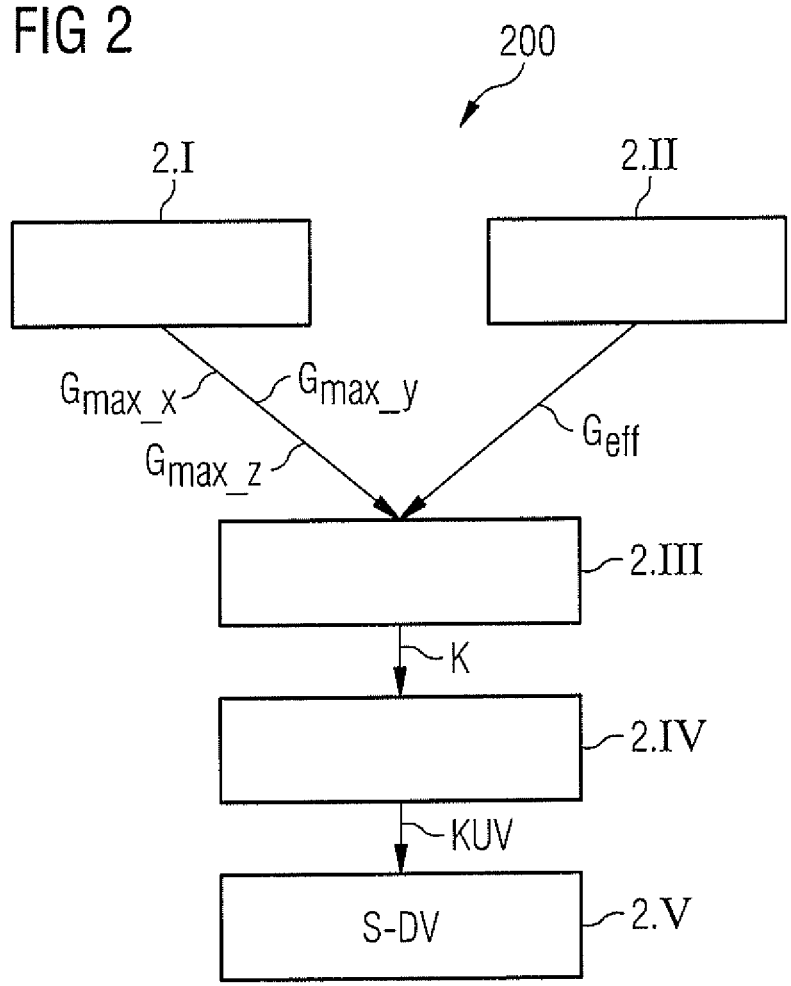
FIG. 2 shows a flowchart with the main steps of a method for establishing diffusion gradients for a recording of diffusion-weighted magnetic resonance image data with anisotropic diffusion directions for creation of a trace-weighted image in accordance with an exemplary embodiment of the invention.

FIG. 2 shows a flowchart 200, with which a method for establishing diffusion gradients for a recording of diffusion-weighted magnetic resonance image data with anisotropic diffusion directions for creation of a trace-weighted image is illustrated in accordance with an exemplary embodiment of the invention. In step 2.1 first of all information relating to the maximum gradient amplitudes $G_{max\_x}$, $G_{max\_y}$, $G_{max\_z}$ of the gradients in the direction of the physical gradient axes Gx, Gy, Gz is established. These gradient amplitudes are produced from the maximum power of the gradient coils of a magnetic resonance imaging system used and are usually to be taken from the system specifications of the device concerned. These maximum gradient amplitudes $G_{max\_x}$, $G_{max\_y}$, $G_{max\_z}$ define a space of realizable diffusion gradient vectors as a cuboid, oriented along the physical gradient axes Gx, Gy, Gz, with an extent of the edges of the cuboid corresponding to the maximum gradient amplitudes $+/-G_{max\_x}$, $+/-G_{max\_y}$, $+/-G_{max\_z}$ of the gradients in the direction of the physical gradient axes Gx, Gy, Gz. Now, in step 2.11, a value for an effective gradient amplitude $G_{eff}$ is defined. This value can, in a later choice of six diffusion gradient vectors, advantageously be selected such that the effective gradient amplitude $G_{eff}$ is smaller than $\sqrt{3}$ times the maximum largest of the maximum gradient amplitudes $G_{max\_x}$, $G_{max\_y}$, $G_{max\_z}$.

Now, in step 2.111, on the basis of the chosen value of the effective gradient amplitude $G_{eff}$, a sphere K around the origin of the physical gradient axes Gx, Gy, Gz is established with a radius, of which the value corresponds to the value of the effective gradient amplitude $G_{eff}$. Subsequently, in step 2.1V, those sections of the sphere surface KOF of the sphere K that lie within the cuboid, are established as end points of possible candidate origin vectors KUV. Finally, in step 2.V, a set S-DV of at least six diffusion gradient vectors DV is selected from the set of candidate origin vectors KUV, which fulfill the additional conditions for the creation of a low-artifact trace-weighted image.

The established set S-DV of diffusion gradient vectors DV can now be emitted within the framework of a method for recording of diffusion-weighted magnetic resonance image data of an examination object O. In such a diffusion-weighted magnetic resonance imaging method diffusion-encoded raw image data is acquired by means of a diffusion encoding gradient pulse sequence, having the established diffusion gradient vectors. The said diffusion encoding gradient pulse sequence can have a form shown in FIG. 1, wherein there the diffusion gradient GDW, for the sake of simplicity, only illustrates one dimension of the physical gradient axes Gx, Gy, Gz. Diffusion-encoded, trace-weighted image data is reconstructed on the basis of the acquired diffusion-encoded raw image data. Subsequently a diffusion behavior is established on the basis of the diffusion-encoded, trace-weighted image data.

Figure 3:
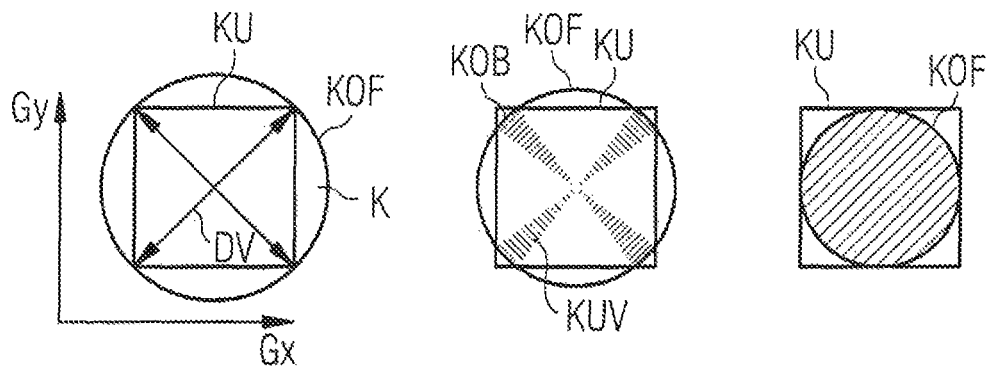
FIG. 3 shows a projection of a cube representing the space of realizable diffusion gradient vectors and a surface of a sphere intersecting this cube, wherein the radius of the associated sphere corresponds to the value of an effective gradient.

Show in FIG. 3 for illustration is a projection of a cube KU representing the space of realizable diffusion gradient vectors DV and a sphere surface KOF intersecting this cube KU on the GxGy plane. The half edge length of the cube K precisely corresponds to a maximum gradient amplitude $G_{max}$. Thus, in the examples shown in FIG. 3, the maximum values $G_{max}$ of the gradient amplitude on all physical gradient axes Gx, Gy, Gz are the same. In this case the radius of the associated sphere K corresponds to the value of a selected effective gradient amplitude $G_{eff}$.

At the left in FIG. 3, the sphere surface KOF of the sphere K intersects with the cube KU precisely at its corners. In this example the value of the selected effective gradient amplitude $G_{eff}$ corresponds precisely to $\sqrt{3}$ times the maximum value $G_{max}$ of the gradient amplitude on all physical gradient axes Gx, Gy, Gz. The intersection points at the corners of the cube KU correspond to possible diffusion gradient vectors DV. However in this example only four non-collinear diffusion gradient vectors DV are possible, so that an effective artifact suppression is not absolutely guaranteed, since this needs more diffusion gradient vectors DV, which meet the said conditions for diffusion gradient vectors DV for the trace-weighted imaging in accordance with equation (2).

In a central part of the drawing shown in FIG. 3 a smaller value than $\sqrt{3}$ times the maximum value $G_{max}$ of the gradient amplitude on all physical gradient axes Gx, Gy, Gz has been selected for the effective gradient amplitude $G_{eff}$. There are now sphere surface areas KOB of the sphere surface KOF of the sphere K that lie within the cube KU. These sphere surface area KOB form the end points of possible candidate origin vectors KUV for diffusion gradient vectors DV. In this example there are many options for the definition of diffusion gradient vectors DV, which are suitable for a trace calculation.

In the example shown in the right-hand part of the drawing in FIG. 3 a value has been selected for the effective gradient amplitude $G_{eff}$, which corresponds to the maximum value $G_{max}$ of the gradient amplitude on all physical gradient axes Gx, Gy, Gz. In this example all points of the sphere surface KOF lie within the cube KU. In this example there is thus no restriction that relates to the direction of possible candidate origin vectors KUV for diffusion gradient vectors DV. Accordingly the choice of the directions of the diffusion gradient vectors DV is only restricted by the conditions according to equation (2) already stated a number of times for the creation of a low-artifact trace-weighted image. However the diffusion gradient vectors DV established in this way, which are suitable for trace-weighted imaging, have only one effective gradient amplitude $G_{eff}$, which corresponds to the maximum value $G_{max}$ of the gradient amplitude on the physical gradient axes Gx, Gy, Gz.

The method of operation illustrated in the central part of the drawing shown in FIG. 3 corresponds to an exemplary embodiment of the inventive method for establishing diffusion gradients for a recording of diffusion-weighted magnetic resonance image data with anisotropic diffusion directions for the trace-weighted imaging. In this example suitable sets of directions that satisfy the equation (2) can be selected from a plurality of candidate vectors from the shaded area.

Figure 4:
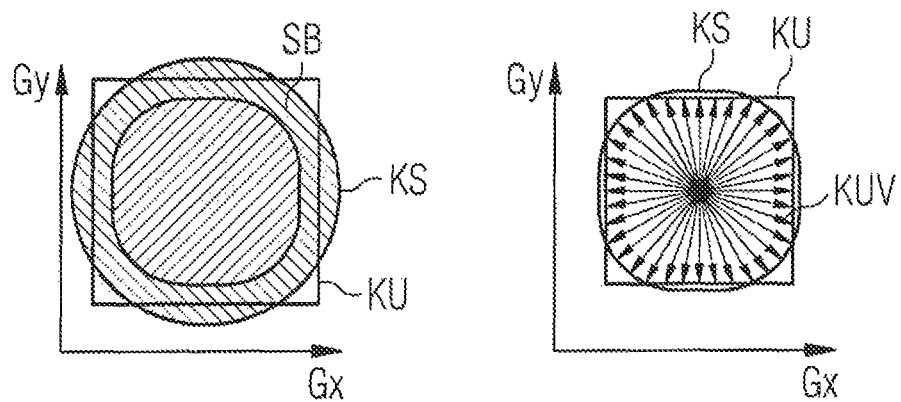
FIG. 4 shows a projection of a cube representing the space of realizable diffusion gradient vectors and a spherical shell intersecting this cube, wherein the spherical shell represents possible values of effective gradient amplitudes.

Shown in FIG. 4, at the left, are a projection of a cube KU representing the space of realizable diffusion gradient vectors DV and a spherical shell KS intersecting this cube KU, wherein the spherical shell KS represents possible values of effective gradient amplitudes $G_{eff}$. In this variant, by comparison with the variant shown in the center section in FIG. 3, there is a greater degree of freedom of the selectable candidate origin vectors KUV, wherein a slight variation of the b values for different directions is taken into account.

In this case the trace condition, i.e. equation (2) must be met, At least minimum deviations of the b value are tolerable if necessary. Furthermore a number of anisotropic directions with markedly different b values can be found, which still satisfy equation (2).

In FIG. 4 the areas SB within the part of the spherical shell KS lying within the cube KU now define end points of possible candidate origin vectors KUV. In the exemplary embodiment shown in FIG. 4, the outer surface of the spherical shell KS just intersects with the corners of the cube KU. Were the possible candidate origin vectors KUV now to be restricted to the outer surface of the spherical shell KS, then, as in the example shown in the left-hand part of the drawing shown in FIG. 3, only four allowed diffusion gradient vectors DV would be produced, so that a trace-weighted imaging with anisotropic diffusion gradient vectors DV would not be possible. However the thickness of the spherical shell KS means that candidate origin vectors KUV with somewhat smaller gradient amplitude are now allowed, which makes possible a larger number of diffusion gradient vectors DV, so that in the exemplary embodiment shown in FIG. 4, a trace-weighted imaging is possible without any problems. While the outer surface of the spherical shell KS corresponds to a predetermined maximum value $G_{eff\_max}$ of an effective gradient amplitude, the inner surface of the spherical shell KS corresponds to a predetermined minimum value $G_{eff\_min}$ of an effective gradient amplitude, which is larger however than with conventional sets of diffusion gradients. Candidate origin vectors from the spherical shell KS thus make possible the choice of diffusion gradient vectors with an effective gradient amplitude, which is larger than with conventional sets of diffusion gradients. Thus an increased value by comparison with the prior art for the effective gradient amplitude of the diffusion gradient vectors DV established is achieved.

As already mentioned, this is linked to advantages that relate to the achievable signal-to-noise ratio SNR of an individual measurement. This is because with shortened diffusion encoding time, relaxation influences, for example through a reduction of the echo time TE that is then possible, will reduce. As likewise already mentioned, the SNR gain is able to be used for example to improve the image quality, for the reduction of the measurement time or for increasing the resolution.

In the right part of the drawing in FIG. 4 a number of possible candidate origin vectors KUV are shown, which can be used for establishing suitable diffusion gradient vectors.

Figure 5:
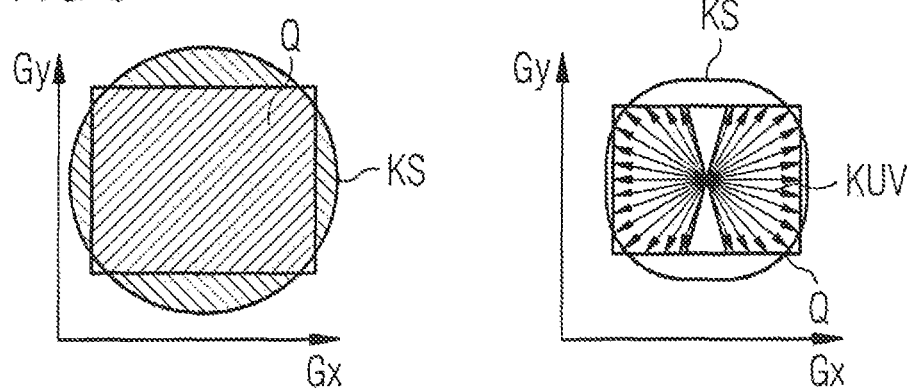
FIG. 5 shows a projection of a cuboid representing the space of realizable diffusion gradient vectors and a spherical shell intersecting this cube, wherein the spherical shell represents possible values of effective gradient amplitudes.

Shown at the left part of FIG. 5 is a projection of a cuboid Q representing the space of realizable diffusion gradient vectors DV and a spherical shell KS intersecting this cube KU. Thus in this exemplary embodiment, the values of the maximum gradient amplitudes on the physical gradient axes Gx, Gy, Gz are different. Also in this exemplary embodiment, the spherical shell KS represents possible values of effective gradient amplitudes. In this variant a greater degree of freedom of the selectable candidate origin vectors KUV is likewise produced. In the exemplary embodiment shown in FIG. 5 the areas of the part of the spherical shell KS lying within the cuboid Q now define the end points of possible candidate origin vectors KUV.

In the exemplary embodiment shown in FIG. 5 a somewhat larger value has been selected for the value of the maximum gradient amplitude $G_{max\_x}$ on the physical gradient x-axis Gx than in the exemplary embodiment shown in FIG. 4, which has led to the square form or rectangular form shown in FIG. 5 of the cuboid Q representing the space of realizable diffusion gradient vectors. The outer radius of the spherical shell KS corresponds in the exemplary embodiment shown in FIG. 5 to a predetermined maximum value $G_{eff\_max}$ of the effective gradient amplitude. The inner radius of the spherical shell KS corresponds to a predetermined minimum value $G_{eff\_min}$ of the effective gradient amplitude.

Shown at the right in FIG. 5 are a number of possible candidate origin vectors KUV, which can be used for the establishment of suitable diffusion gradient vectors, wherein the condition (2) mentioned at the beginning must still be satisfied, so that a trace-weighted image can be created from a set of diffusion directions. What is striking here is that because of the rectangular form or square form of the area Q representing the space of realizable diffusion gradient vectors and also the choice of the minimum value of the effective gradient amplitude, all directions are now no longer available for the formation of diffusion gradient.

Figure 6:
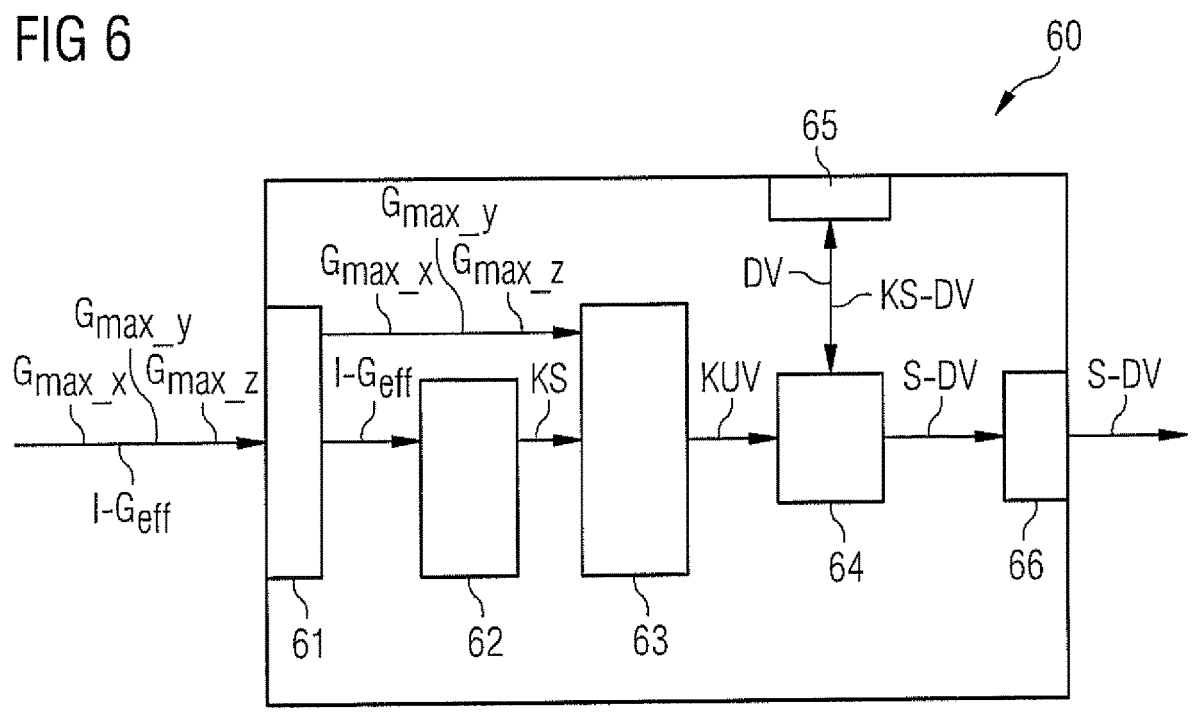
FIG. 6 is a block diagram of a computer for establishing diffusion gradients in accordance with an exemplary embodiment of the invention.

Illustrated in FIG. 6 is a computer for establishing diffusion gradients 60 in accordance with an exemplary embodiment of the invention. This can for example be a part of the control computer 13 (see FIG. 7) of a magnetic resonance apparatus 1 (see FIG. 7). The device for establishing diffusion gradients 60 has an input interface 61, which receives information relating to the maximum gradient amplitudes $G_{max\_x}$, $G_{max\_y}$, $G_{max\_z}$ of the gradients in the direction of the physical gradient axes Gx, Gy, Gz. The maximum gradient amplitudes $G_{max\_x}$, $G_{max\_y}$, $G_{max\_z}$ define the space of realizable diffusion gradient vectors as a cuboid, oriented in parallel to the physical gradient axes Gx, Gy, Gz, with an extent of the edges of the cuboid corresponding to the values of the gradient amplitudes $G_{max\_x}$, $G_{max\_y}$, $G_{max\_z}$. This information is usually to be taken from the system specification and can be entered by a user for example or also be transmitted automatically to the device for establishing diffusion gradients 60 or alternatively already be known to said device in advance.

The input interface 61 also receives information relating to a selected value interval I-$G_{eff}$ for an effective gradient amplitude $G_{eff}$ with a minimum value $G_{eff\_min}$ and a maximum value $G_{eff\_max}$ for the effective gradient amplitude $G_{eff}$. The image data relating to the value interval I-$G_{eff}$ is subsequently transferred to a processor 62 for establishing a spherical shell, which establishes from this information a spherical shell KS around the origin of the physical gradient axes Gx, Gy, Gz with an internal radius with the minimum value $G_{eff\_min}$ and an external radius with the maximum value $G_{eff\_max}$. This spherical shell KS can be represented, for example, as an inequation with the said minimum and maximum values and also a first-order sphere surface function:

$$G_{eff\_min} < \sqrt{G_x^2 + G_y^2 + G_z^2} < G_{eff\_max} \quad (7)$$

The information about the spherical shell KS established and the value of the maximum gradient amplitudes $G_{max\_x}$, $G_{max\_y}$, $G_{max\_z}$ is transferred to the processor 63 for establishing an area, which establishes from this information those areas of the spherical shell KS that lie within the cuboid Q. These values must thus, in addition to the inequation (7), also satisfy the following inequations:

$$|Gx| <= G_{max\_x}, \quad (8)$$

$$|Gx| <= G_{max\_y}, \quad (9)$$

$$|Gx| <= G_{max\_z}. \quad (10)$$

The gradient coordinates of the solutions of the inequation system of the inequations 8 to 10 can be seen as end points of possible candidate origin vectors KUV. These candidate origin vectors KUV are subsequently transferred to a selection processor 64. The selection processor 64 can now either select automatically from the set of candidate origin vectors, by taking account of the condition (2) already mentioned several times, which must be satisfied so that a trace-weighted image can be created from a set of diffusion directions, a suitable set of at least six anisotropic diffusion gradient vectors, or it communicates via a communication interface 65 with the user or other units of the control computer 13 (see FIG. 7). For example a user can select a set of diffusion gradient vectors DV appearing appropriate to him from a plurality of candidate sets KS-DV of diffusion gradient vectors DV established by the selection processor 64. Finally an ultimately selected set S-DV of diffusion gradient vectors DV is forwarded via the output interface 66 to other units of the control computer 13 (see FIG. 7).

Figure 7:
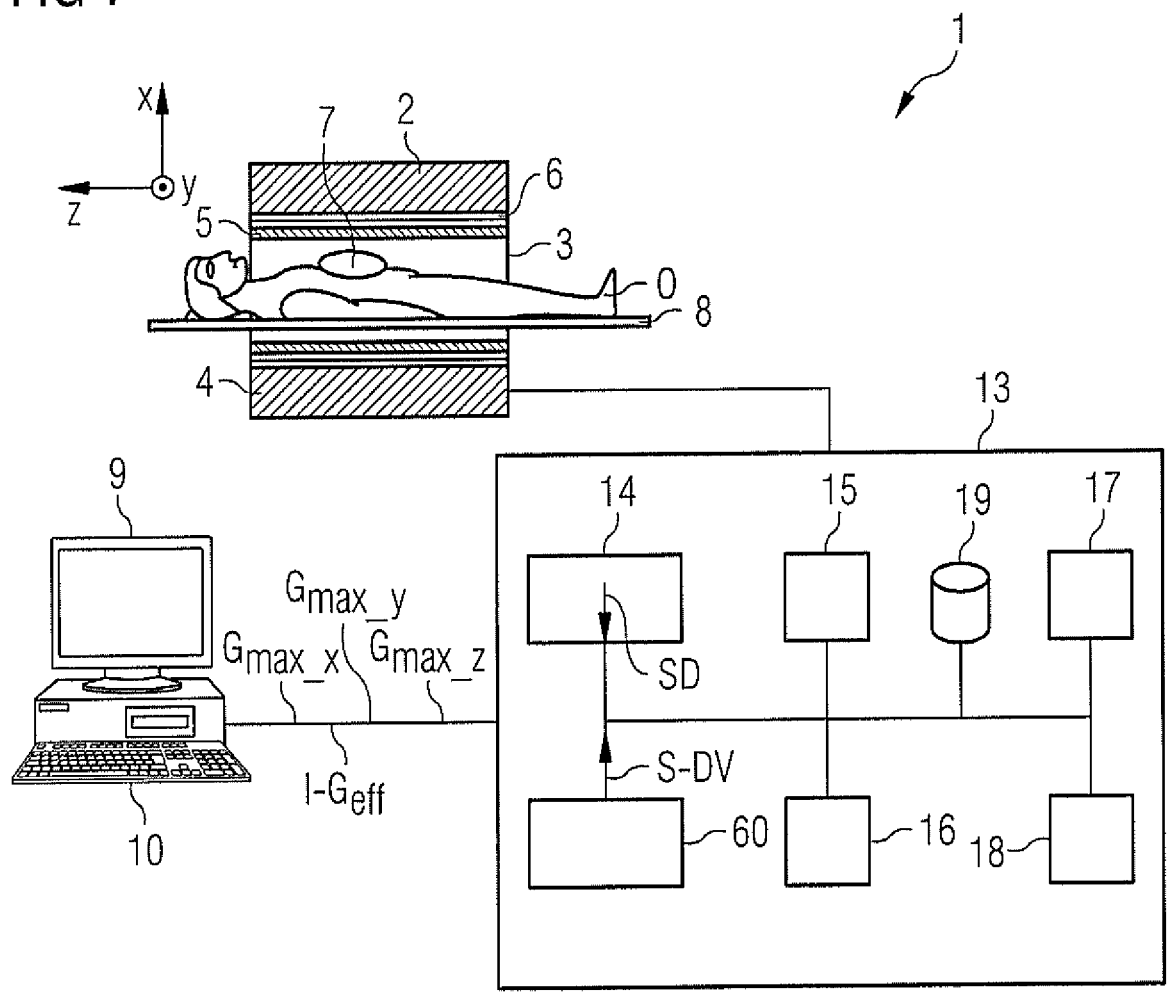
FIG. 7 schematically illustrates a magnetic resonance apparatus in accordance with an exemplary embodiment of the invention.

FIG. 7 shows a rough schematic of an inventive magnetic resonance apparatus 1 (abbreviated below to "MR apparatus"). The actual magnetic resonance scanner 2 has an examination space 3 or patient tunnel, into which an examination object O, or here a patient or test subject, in whose body the examination object, for example a specific organ, is located, can be moved on a table 8.

The magnetic resonance scanner 2 is equipped in the usual way with a basic field magnet system 4, a gradient coil system 6 and also an RF transmit antenna system 5 and an RF reception antenna system 7. In the exemplary embodiment shown the RF transmit antenna system 5 involves a whole body coil installed permanently in the magnetic resonance scanner 2, while the RF reception antenna system 7 is formed by local coils that are arranged on the patient or test subject (symbolized in FIG. 7 by just one individual local coil). Basically however the whole body coil can also be used as the RF reception antenna system and the local coils as the RF transmit antenna system, provided these coils are able to be switched in each case into different modes of operation.

The MR apparatus 1 further has a central control computer 13, which is used for controlling the MR apparatus 1. This central control computer 13 has a sequence controller 14 for pulse sequence control. With this unit the order of radio-frequency pulses (RF pulses) and of gradient pulse is controlled as a function of a selected imaging sequence. Such an imaging sequence can be predetermined for example within a measurement or control protocol. Usually different control protocols for different measurements are stored in a memory 19 and can be selected by an operator (and possibly changed if required) and then used for carrying out the measurement.

For output of the individual RF pulses the central control computer 13 has a radio-frequency transmit controller 15, which creates the RF pulses, amplifies them and feeds then via a suitable interface (not shown in detail) into the RF transmit antenna system 5. For control of the gradient coils of the gradient system 6, the control computer 13 has a gradient system interface 16. The sequence controller 14 communicates in a suitable way, e.g. by sending out sequence control image data SD, with the radio-frequency transmit controller 15 and the gradient system interface 16 for transmission of the pulse sequences.

The control computer 13 also has a radio-frequency reception device 17 (likewise communicating in a suitable way with the sequence controller 14), in order to acquire magnetic resonance signals, i.e. raw image data, received from the RF transmit antenna system 7, in a coordinated manner. A reconstruction processor 18 accepts the acquired raw image data and reconstructs the MR image data from it. This image data can then be stored in a memory 19 for example.

Furthermore the control computer 13 shown in FIG. 7 has a computer 60 for establishing diffusion gradients in accordance with an exemplary embodiment of the invention, which establishes sets S-DV of suitable diffusion gradient vectors DV in the way described in FIG. 2 to FIG. 6. The sets S-DV of suitable diffusion gradient vectors DV established are subsequently transferred to the sequence controller 14, which on the basis of a measurement protocol modified with the established diffusion gradient vectors DV, carries out a pulse sequence control.

As an alternative the sets S-DV of diffusion gradient vectors DV established can also be stored in the memory 19 or transferred to an input unit 10. As an alternative the device for establishing diffusion gradients 60 can also be integrated into the input unit 10, for example in the form of software, or can be linked external via a network of the like to the central control computer 1:3.

The central control computer 13 can be controlled via a terminal with the said input unit 10 and a display unit 9, via which the entire MR apparatus 1 can also be operated by an operator. MR images can also be displayed on the display unit 9, and via the input unit 10, if necessary in combination with the display unit 9, measurements can be planned and started and in particular suitable control protocols with suitable measurement sequences as explained above can be selected and if necessary modified. The input unit 10 can also be used for selection of image datasets S-DV established by the device for establishing diffusion gradients 60 of suitable diffusion gradient vectors DV as well as for changing a measurement protocol already present beforehand by changing the diffusion gradient vectors DV. In this case image data can also be transferred between the input unit 10 and the control computer 13, such as the maximum gradient amplitude $G_{max\_x}$, $G_{max\_y}$, $G_{max\_z}$ in the direction of the physical gradient axis Gx, Gy, Gz or a value interval I-$G_{eff}$ for an effective gradient amplitude $G_{eff}$, from the input unit 10 to the control computer 13.

The inventive MR apparatus 1 and in particular the control computer 13 can in addition also have further components not shown herein individually that are usually present in such apparatuses, such as a network interface, in order to connect the entire system to a network and be able to exchange raw image data and/or image data or parameter maps, but also further image data, such as for example patient-relevant image data or control protocols.

The acquisition of raw MR data by radiation of RF pulses and the creation of gradient fields, and how MR images can be reconstructed from such MR data, are basically known to those skilled in the art, and thus need not be explained herein in greater detail. Likewise a very wide variety of measurement sequences, such as EPI measurement sequences or other measurement sequences for creation of diffusion-weighted images, are fundamentally known to those skilled in the art.

In conclusion it is pointed out once again that the method and structures described above in detail merely involve exemplary embodiments and that the basic principle can also be varied by those skilled in the art in wide areas, without departing from the scope of the invention, provided it is predetermined by the claims. In particular, as already mentioned, the method for recording of diffusion-weighted magnetic resonance image data of an examination object for creation of a trace-weighted image is not restricted to diffusion-weighted imaging with the aid of a Stejskal-Tanner sequence. Furthermore the method described is also not restricted to medical applications. For the sake of completeness it is also pointed out that the use of the indefinite article "a" or "an" does not exclude features involved also being able to be present multiple times. Likewise the term "unit" does not preclude such a unit from being formed by a number of components, which can, if necessary, be physically distributed.

The invention claimed is:

1. A method for operating a magnetic resonance (MR) scanner in order to acquire diffusion-weighted MR data with anisotropic diffusion directions from an examination region of a subject, so as to produce a trace-weighted image of said examination region from said diffusion-weighted MR data, said MR scanner comprising a gradient system having a gradient coil arrangement defined by physical gradient axes that intersect each other at an origin, said method comprising:

in a computer, executing an algorithm that defines a space of diffusion-gradient vectors that are achievable by said gradient system, as a cuboid having edges oriented along said physical gradient axes, with an extent of said edges corresponding to a maximum gradient amplitude that is achievable by said gradient system along said physical gradient axes;

in said computer in said algorithm, selecting a value interval for an effective gradient amplitude that defines a minimum value and a maximum value of said effective gradient amplitude;

in said computer in said algorithm, establishing a spherical shell around said origin, said spherical shell having an inner radius equal to said minimum value and an outer radius equal to said maximum value;

in said computer in said algorithm, identifying areas of said spherical shell that are within said cuboid, as end points of origin vectors that respective start at said origin;

in said computer in said algorithm, selecting, from said set of origin vectors, a set of at least six diffusion-gradient vectors that fulfil conditions for producing said trace-weighted image with low image artifacts;

in said computer, generating control signals that operate said gradient system so as to produce diffusion gradient fields defined by said at least six diffusion-gradient vectors;

from said computer, operating said MR scanner with said control signals in order to acquire said diffusion-weighted MR data; and in said computer, reconstructing, from the acquired diffusion-weighted MR data, trace-weighted image data that represent said trace-weighted image with low image artifacts, and making said trace-weighted image data available from said computer in electronic form as a data file.

2. A method as claimed in claim 1 comprising, in said computer in said algorithm, using, as said conditions for producing said trace-weighted image with low image artifacts:

$$N/3 b1 = \sum_{n=1...N} b_n,$$

wherein I represents the identity matrix, b represents a b-value of diffusion weighting, and $b_n$ represents b matrices assigned to N diffusion directions; and respective directions of said diffusion-gradient vectors have an anisotropic distribution.

3. A method as claimed in claim 1 comprising selecting said value interval so that said maximum value of said effective gradient amplitude is less than $\sqrt{3}$ times a largest maximum gradient amplitude along said physical gradient axes.

4. A method as claimed in claim 1 comprising defining said cuboid as a cube wherein said maximum gradient amplitudes each have a same value.

5. A method as claimed in claim 1 comprising defining said value interval so that said effective gradient amplitude converges toward a limit value, with said minimum value and said maximum value being equal to said limit value, and defining said spherical shell as a sphere surface.

6. A method as claimed in claim 5 comprising establishing said areas that serve as said end points of said origin vectors as points on said sphere surface that lie within said cube.

7. A method as claimed in claim 1 comprising in said computer in said algorithm, defining a set of directions of said at least six diffusion gradient vectors based on a combination of three orthogonal vectors and wherein a magnitude of all components in each set of directions has a value that is less than or equal to one.

8. A method as claimed in claim 7 comprising, in said computer in said algorithm, setting said effective gradient amplitude to have a value of $$\sqrt{\frac{9}{4}}$$

times the maximum gradient amplitude, and selecting said diffusion-gradient vector set as a combination of at least two sets of the following sets of three orthogonal vectors:

(+1, +1, +½), (+1, −½, −1), (+½, −1, +1);
(+1, −1, +½), (+1, +½, −1), (+½, +1, +1);
(+1, +1, −½), (+1, −½, +1), (+½, −1, −1);
(+1, −1, −½), (+1, +½, +1), (+½, +1, −1);
(−1, −1, −½), (−1, +½, +1), (−½, +1, −1);
(−1, +1, −½), (−1, −½, +1), (−½, −1, −1);
(−1, −1, +½), (−1, +½, −1), (−½, +1, +1);
(−1, −1, +½), (−1, −½, −1), (−½, −1, +1).

9. A method as claimed in claim 8 wherein one of the vectors in said combination is inverted from three orthogonal vectors.

10. A method as claimed in claim 1 comprising in said computer in said algorithm, defining a set of directions of said at least six diffusion gradient vectors based on a combination of six octahedral vectors and wherein a magnitude of all components in each set of directions has a value that is less than or equal to one.

11. A method as claimed in claim 10 comprising selecting said set of diffusion-gradient vectors as a combination of at least two sets of the following sets:

(+1, 0, +1), (+1, 0, −1), (+1/√2, +1, +1/√2), (−1/√2, +1, +1/√2), (+1/√2, +1, −1/√2), (−1/√2, +1, −1/√2);
(0, +1, +1), (0, +1, −1), (+1, +1/√2, +1/√2), (+1, −1/√2, +1/√2), (+1, +1/√2, −1/√2), (+1, −1/√2, −1/√2);
(+1, +1, 0), (+1, −1, 0), (+1/√2, +1/√2, +1), (−1/√2, +1/√2, +1), (+1/√2, −1/√2, +1), (−1/√2, −1/√2, +1).

12. A method as claimed in claim 10 wherein one of the vectors in said combination is inverted from three orthogonal vectors.

13. A method as claimed in claim 1 comprising displaying said trace-weighted image and determining a diffusion behavior of said examination region from the displayed trace-weighted image.

14. A method as claimed in claim 13 wherein said gradient system exhibits a non-linearity, and using said non-linearity of said gradient system when establishing said diffusion behavior.

15. A method as claimed in claim 13 comprising, in said computer, receiving an input that designates a number N of isotropic directions and a number K of averagings per direction, and establishing said set of diffusion-gradient vectors with N*K anisotropic directions with identical effective gradient amplitudes.

16. A magnetic resonance (MR) apparatus for acquiring diffusion-weighted MR data with anisotropic diffusion directions from an examination region of a subject, so as to produce a trace-weighted image of said examination region from said diffusion-weighted MR data, said apparatus comprising:

an MR scanner comprising a gradient system having a gradient coil arrangement defined by physical gradient axes that intersect each other at an origin;

a computer configured to execute an algorithm that defines a space of diffusion-gradient vectors that are achievable by said gradient system, as a cuboid having edges oriented along said physical gradient axes, with an extent of said edges corresponding to a maximum gradient amplitude that is achievable by said gradient system along said physical gradient axes;

said computer being configured to execute said algorithm so as to select a value interval for an effective gradient amplitude that defines a minimum value and a maximum value of said effective gradient amplitude;

said computer being configured to execute said algorithm so as to establish a spherical shell around said origin, said spherical shell having an inner radius equal to said minimum value and an outer radius equal to said maximum value;

said computer being configured to execute said algorithm so as to identify areas of said spherical shell that are within said cuboid, as end points of origin vectors that respective start at said origin;

said computer being configured in said algorithm to select, from said set of origin vectors, a set of at least six diffusion-gradient vectors that fulfil conditions for producing said trace-weighted image with low image artifacts;

said computer being configured to generate control signals that operate said gradient system so as to produce diffusion gradient fields defined by said at least six diffusion-gradient vectors;

said computer being configured to operate said MR scanner with said control signals in order to acquire said diffusion-weighted MR data; and said computer being configured to reconstruct, from the acquired diffusion-weighted MR data, trace-weighted image data that represent said trace-weighted image with low image artifacts, and to make said trace-weighted image data available from said computer in electronic form as a data file.

17. A non-transitory, computer-readable data storage medium encoded with programming instructions for operating a magnetic resonance (MR) scanner in order to acquire diffusion-weighted MR data with anisotropic diffusion directions from an examination region of a subject, so as to produce a trace-weighted image of said examination region from said diffusion-weighted MR data, said MR scanner comprising a gradient system having a gradient coil arrangement defined by physical gradient axes that intersect each other at an origin, said storage medium being loaded into a computer and said programming instructions causing said computer to:

execute an algorithm that defines a space of diffusion-gradient vectors that are achievable by said gradient system, as a cuboid having edges oriented along said physical gradient axes, with an extent of said edges corresponding to a maximum gradient amplitude that is achievable by said gradient system along said physical gradient axes;

in said algorithm, select a value interval for an effective gradient amplitude that defines a minimum value and a maximum value of said effective gradient amplitude;

in said algorithm, establish a spherical shell around said origin, said spherical shell having an inner radius equal to said minimum value and an outer radius equal to said maximum value;

in said algorithm, identify areas of said spherical shell that are within said cuboid, as end points of origin vectors that respective start at said origin;

in said algorithm, select, from said set of origin vectors, a set of at least six diffusion-gradient vectors that fulfil conditions for producing said trace-weighted image with low image artifacts;

generate control signals that operate said gradient system so as to produce diffusion gradient fields defined by said at least six diffusion-gradient vectors;

operate said MR scanner with said control signals in order to acquire said diffusion-weighted MR data; and reconstruct, from the acquired diffusion-weighted MR data, trace-weighted image data that represent said trace-weighted image with low image artifacts, and make said trace-weighted image data available from said computer in electronic form as a data file.

* * * * *